United States Patent
Banin et al.

(10) Patent No.: US 9,571,107 B2
(45) Date of Patent: Feb. 14, 2017

(54) HIGH-ORDER SIGMA DELTA FOR A DIVIDER-LESS DIGITAL PHASE-LOCKED LOOP

(71) Applicant: Intel IP Corporation, Santa Clara, CA (US)

(72) Inventors: Rotem Banin, Pardes-Hana (IL); Elan Banin, Raanana (IL); Ofir Degani, Haifa (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/317,435

(22) Filed: Jun. 27, 2014

(65) Prior Publication Data
US 2015/0381188 A1     Dec. 31, 2015

(51) Int. Cl.
| | |
|---|---|
| H03L 7/08 | (2006.01) |
| H03L 7/085 | (2006.01) |
| H04B 1/40 | (2015.01) |
| H03L 7/16 | (2006.01) |
| H03M 7/30 | (2006.01) |

(52) U.S. Cl.
CPC .............. *H03L 7/085* (2013.01); *H03L 7/16* (2013.01); *H04B 1/40* (2013.01); *H03L 2207/50* (2013.01); *H03M 7/3004* (2013.01)

(58) Field of Classification Search
CPC .......... H03L 7/00; H03L 2207/50; H03L 7/07; H03L 7/0812; H03L 7/085; H03L 7/16; H04B 1/40; H03M 7/3004
USPC .................................................. 375/219, 376
See application file for complete search history.

(56) References Cited

U.S. PATENT DOCUMENTS

| | | | |
|---|---|---|---|
| 8,638,146 B1 | 1/2014 | Lamanna et al. | |
| 2008/0048791 A1* | 2/2008 | Fahim | 331/1 A |
| 2008/0122544 A1* | 5/2008 | Wang | 331/17 |
| 2010/0141314 A1* | 6/2010 | Chen | 327/159 |
| 2012/0244824 A1* | 9/2012 | Entezari et al. | 455/114.2 |
| 2013/0043920 A1* | 2/2013 | Lee et al. | 327/159 |
| 2013/0257494 A1* | 10/2013 | Nikaeen et al. | 327/156 |
| 2014/0086275 A1* | 3/2014 | Kim et al. | 374/170 |
| 2014/0105343 A1* | 4/2014 | Mayer et al. | 375/371 |

FOREIGN PATENT DOCUMENTS

DE   10 2012 022175 A1   2/2014

OTHER PUBLICATIONS

Office Action received for German Patent Application No. 102015108075.3, mailed on Jan. 27, 2016, 5 pages of English Translation and 8 pages of German Office Action.

* cited by examiner

*Primary Examiner* — Freshteh N Aghdam
(74) *Attorney, Agent, or Firm* — Forefront IP Lawgroup of Christie and Rivera, PLLC

(57) ABSTRACT

Described herein are technologies related to an implementation of a divider-less digital phase-locked loop (DPLL) that includes a loop response matching a higher order sigma delta.

18 Claims, 5 Drawing Sheets

HIGH-ORDER SIGMA DELTA FOR A DIVIDER-LESS DIGITAL PHASE-LOCKED LOOP

BACKGROUND

Phase-locked loops (PLLs) are an integral part of many electronics circuits and are particularly important in communication systems or circuits. Depending upon a particular desired application, the PLL may be implemented in a number of different ways i.e., fully-analog implementations, fully-digital implementations, and/or software implementations. Furthermore, two or more PLLs may be coupled together in implementations for various applications. For example, in a frequency multiplier circuit, two or more PLLs may be coupled to provide a certain desired frequency.

The PLL may further be subdivided into two main architectures i.e., a divider-based digital PLL (DPLL) or a divider-less DPLL architecture. The divider based DPLL employs a fractional divider whose ratio may dynamically change in response to a detection of a phase difference between, for example, an output signal of the DPLL and an input signal to the DPLL. As opposed to the divider-less DPLL, the divider-less DPLL does not utilize a fractional divider in its circuitry.

In current designs of the divider based and the divider-less DPLL, there is a need to lower power, area, and complexity, while having better noise shaping and reduction of fractional spurs.

DETAILED DESCRIPTION

Described herein is a technology for implementing a divider-less digital phase-locked loop (DPLL) with a loop response that matches higher order sigma delta in divider-less DPLL.

In an embodiment, a reference frequency oscillator is configured to provide a reference signal while a voltage controlled oscillator (VCO) is configured to provide a feedback signal. In this embodiment, a time-to-digital converter (TDC) receives the reference signal and the feedback signal. For example, the TDC measures a time difference between the reference signal and the feedback signal. In this example, a sigma delta control unit is further coupled to the TDC. The sigma delta control unit, for example, includes an algorithm that cascades at least one first-order sigma delta to the TDC. This cascading of at least one first-order sigma delta facilitates the loop response that matches the higher order sigma delta.

Figure 1:
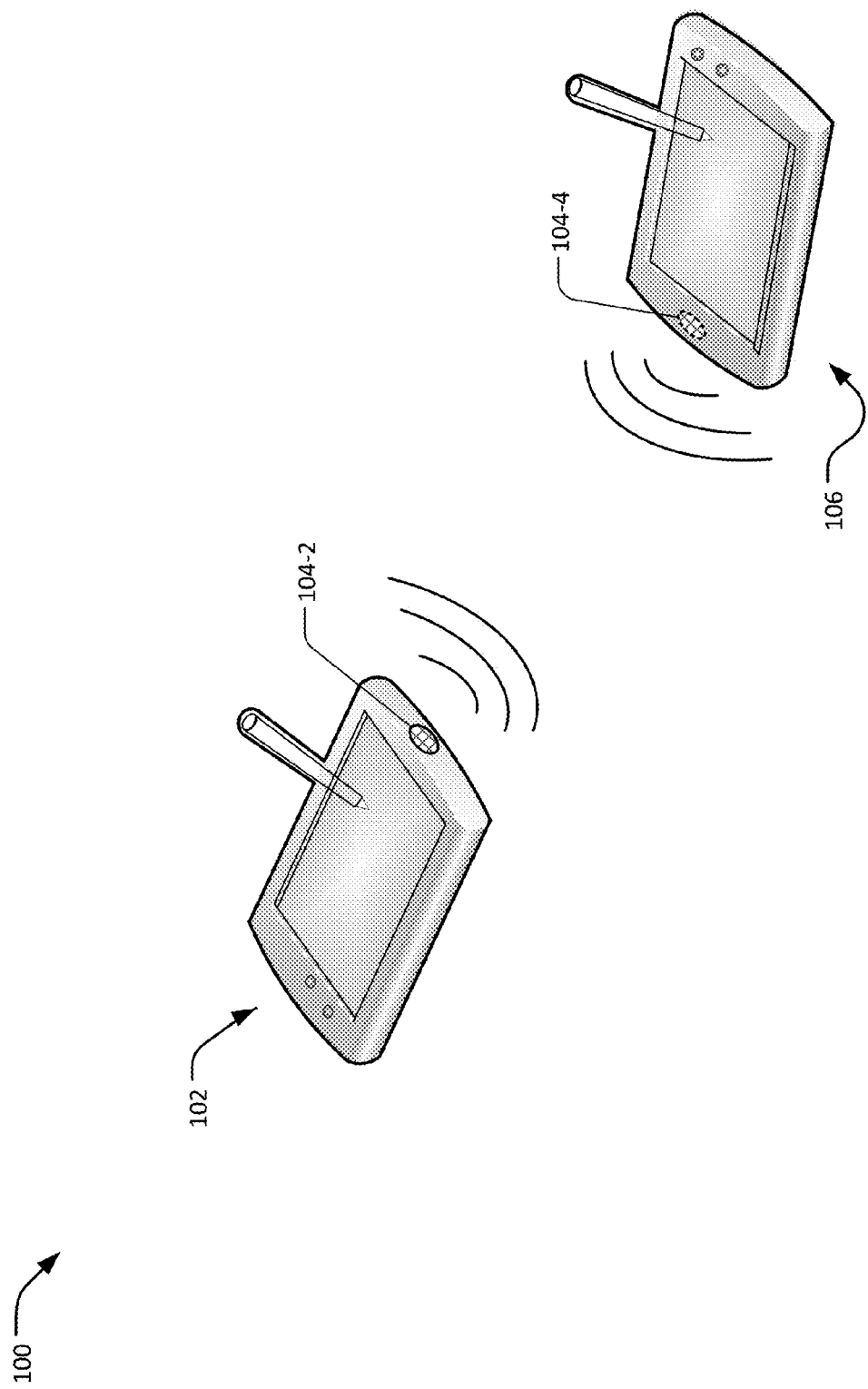
FIG. 1 illustrates an example scenario that utilizes a divider-less DPLL described in present implementations herein.

FIG. 1 is an example scenario 100 that may utilize a divider-less DPLL in its circuitry or system. The scenario 100 shows a portable device 102 with an antenna 104-2, and another portable device 106 with an antennas 104-4.

The portable devices 102 or 106 may include, but are not limited to, a tablet computer, a netbook, a notebook computer, a laptop computer, mobile phone, a cellular phone, a smartphone, a personal digital assistant, a multimedia playback device, a digital music player, a digital video player, a navigational device, a digital camera, and the like.

The portable device 102, for example, may communicate with the other portable device 106 in a network environment. The network environment, for example, includes a cellular network configured to facilitate communications between the portable device 102 and the other portable device 106.

In an implementation, the portable devices 102 and 106 may utilize multiple PLLs in its circuitry or system. The PLL, for example, may generate an output signal whose phase is related to the phase of the input signal. A particular application of this, for example, is with regard to utilization of different carrier frequencies during a communication between the portable devices 102 and 106. In this example, tuning to the different carrier frequencies may require the generation of the PLL output signal whose phase is related to the phase of the incoming signal. In this implementation, the PLL may be a divider-less digital PLL (not shown).

In other examples, the divider-less DPLL may be used for clock synchronization, demodulation, and frequency synthesis in the portable devices 102 or 106. In these examples, the divider-less DPLL may provide stability and minimized fractional spurs in the circuitry or system of the portable devices 102 or 106.

Although the example scenario 100 illustrates in a limited manner basic components of the portable devices 102 and 106, other components such as battery, one or more processors, SIM card, etc. were not described in order to simplify the embodiments described herein.

Figure 2:
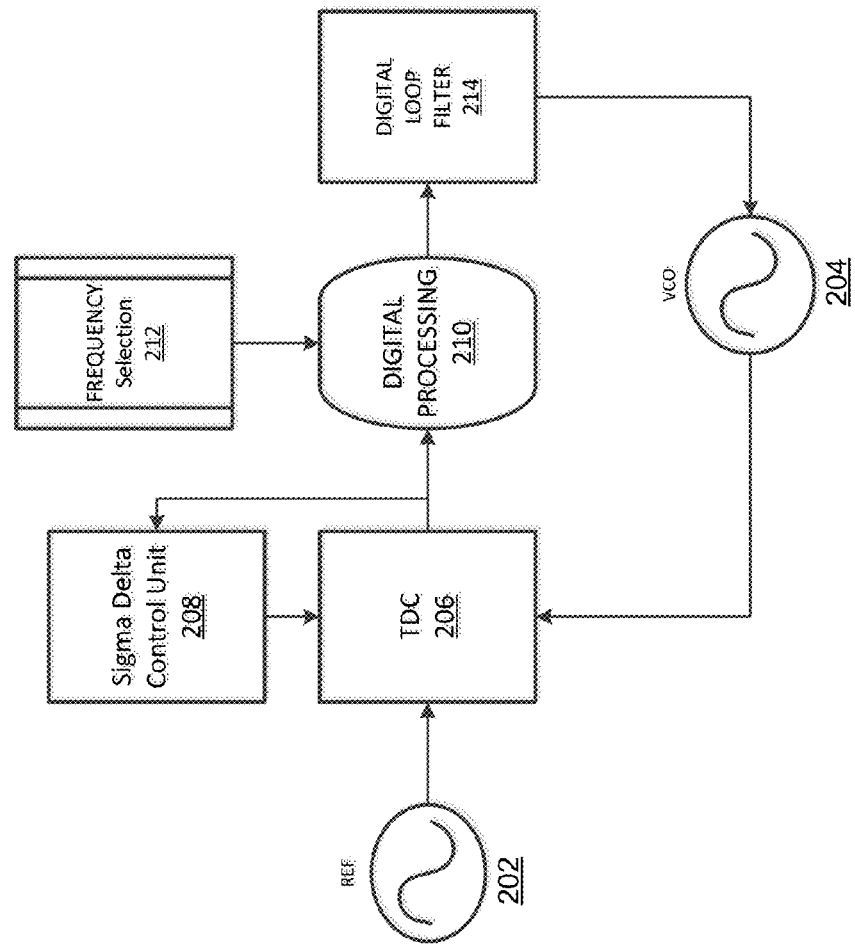
FIG. 2 illustrates an example divider-less DPLL in accordance with implementations described herein.

FIG. 2 is an example divider-less DPLL system 200 as described in present implementations herein. The divider-less DPLL system 200, for example, provides a loop response that matches a higher order sigma delta rather than being limited to a first-order sigma delta divider-less DPLL system.

As shown, the divider-less DPLL system 200 includes a reference frequency oscillator 202, a VCO 204, a TDC 206, a sigma delta control unit 208, a digital processing component 210, a frequency selection component 212, and a digital loop filter 214.

In an implementation, the reference frequency oscillator 202 may generate a reference signal that may be used to update various circuit blocks or signals in the wireless device (e.g., portable device 102 or 104). Particularly, the reference signal may be utilize by the divider-less DPLL system 200 for clock synchronization, demodulation, and frequency synthesis in the portable devices 102 or 106. In this implementation, the reference signal may include a fix or a variable frequency value depending upon a particular application of the divider-less DPLL system 200. For example, in detecting the carrier frequency signal (i.e., reference signal) during frequency modulation (FM) detection, the carrier frequency signal may have a variable frequency value to avoid detection during signal reception.

The TDC 206 may receive the reference signal and the TDC 206 utilizes the received reference signal to facilitate measurements of a delay between the reference signal and a feedback signal. Furthermore, the reference signal may be utilized by the digital processing 210 in measuring, for example, a phase difference, frequency error, and the like, between the reference signal and a feedback signal. The feedback signal, for example, is received by the TDC 206 from an output of the VCO 204.

The VCO 204, for example, may be configured to provide the feedback signal based from a measured phase difference between the reference signal and the feedback signal. For example, the digital processing 210 may be configured to measure the phase difference, frequency error, etc. between the reference signal and the feedback signal. In this example, the measured phase difference, frequency error, etc. passes through the digital loop filter 214, which is a low pass filter that is configured to eliminate DPLL spurs and noises at higher frequencies.

From the digital loop filter 214, a loop control voltage (i.e., output of the digital loop filter 214) is utilized to control the VCO 204. As mentioned above, the VCO 204 provides the feedback signal to an input of the TDC 206.

In a divider-based DPLL (not shown), the feedback signal may pass through a divider circuitry before the feedback signal is received by the TDC 206. However, in the present implementation described herein, the feedback signal may be directly fed to the TDC 206 because the divider-less DPLL system 200 does not require the divider circuitry that may be found in the divider DPLL. However, operations of the TDC 206 and the VCO 204 in the present divider-less DPLL system 200 may match a first-order sigma delta that may be found in the divider-based DPLL.

In an implementation, the sigma delta control unit 208 is coupled to the TDC 206 to provide the loop response that matches the higher order sigma delta. In this implementation, the sigma delta control unit 208 may be connected in parallel to the TDC 206.

The sigma delta control unit 208 may be configured to perform an algorithm that facilitates cascading of at least one first-order sigma delta to a first-order sigma delta behavior like of the TDC 206 and the VCO 204. For example, with a cascaded first-order sigma delta, the sigma delta control unit 208 may facilitate a loop response that matches a second-order sigma delta divider-less DPLL system 200. In this example, the sigma delta control unit 208 utilizes a (N−1) order sigma delta block for the loop response that matches the second-order divider-less DPLL system 200. In another example, the cascading of two first-order sigma deltas may facilitate the loop response that matches a third-order sigma delta divider-less DPLL system 200.

As a result of the cascading described above, the higher order sigma delta divider-less DPLL system 200 may extend the TDC 206 to cover more than one VCO cycle during the measurement and digitization of the delay (i.e., time measurements). For example, for the loop response that matches the second-order sigma delta divider-less DPLL system 200, the TDC 206 may cover zero to two VCO cycles. In this example, the algorithm in the sigma delta control unit 208 may select the edge to be utilized by the TDC 206 in measuring and digitizing of the delay. The loop response, in this example, may provide a lesser spur or noise as compared to the first-order sigma delta divider-less DPLL system 200, if the sigma delta control unit 208 is not added to its circuitry.

With continuing reference to FIG. 2, the frequency selection component 212 may be utilized to provide a frequency selection to the digital processing component 210. For example, during signal conditioning or processing of the TDC 206 output, the digital processing component 210 may utilize the frequency selection as provided by the frequency selection component 212.

Figure 3:
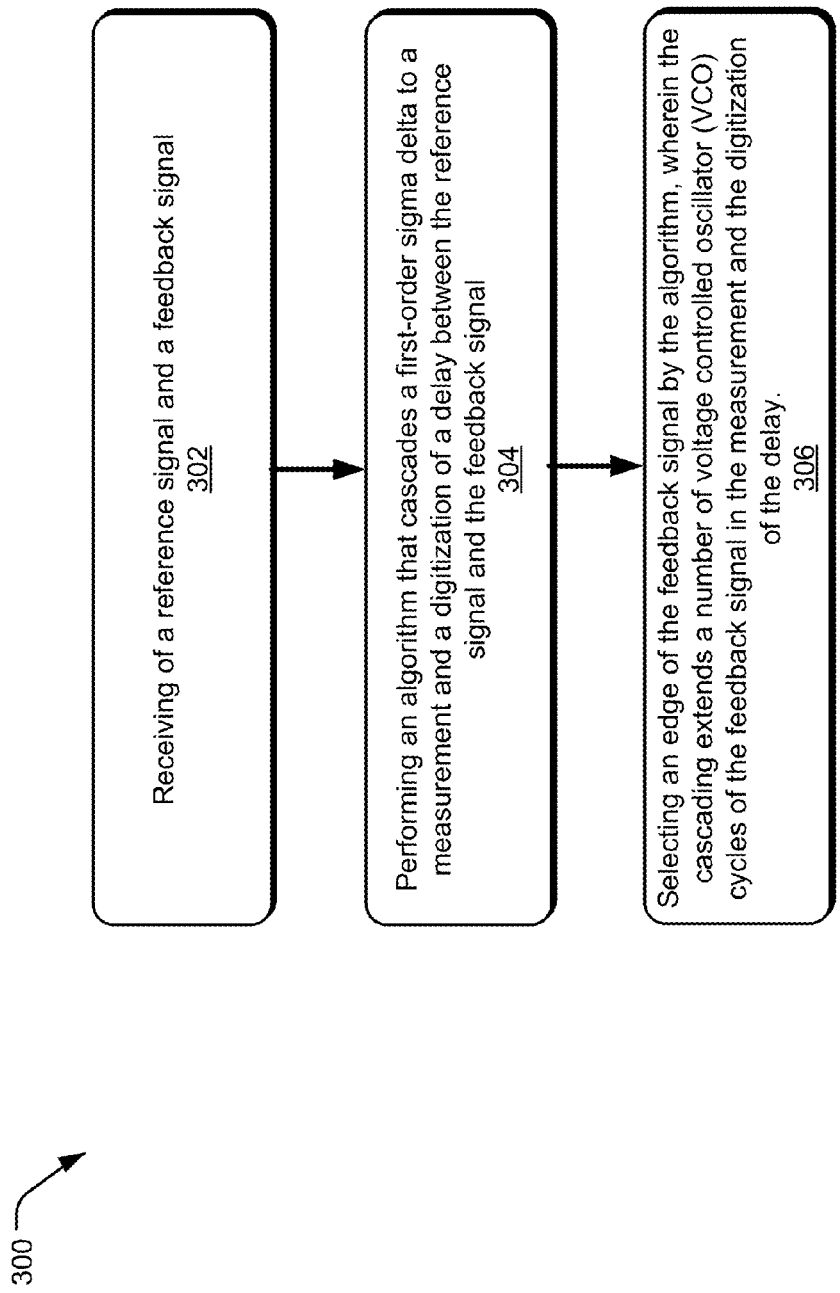
FIG. 3 illustrates an example flowchart for implementing a divider-less DPLL with a loop response that matches a higher order sigma delta.

FIG. 3 shows an example process flowchart 300 illustrating an example method for implementing a divider-less DPLL with a loop response that matches higher order sigma delta in divider-less DPLL. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 302, receiving of a reference signal and a feedback signal is performed. For example, the reference signal and the feedback signal are received from the reference frequency oscillator 202 and the VCO 204, respectively. In this example, the TDC 206 may receive the reference and the feedback signals.

At block 304, performing an algorithm that cascades a first-order sigma delta to a measurement and a digitization of a delay between the reference signal and the feedback signal is performed. For example, the sigma delta control unit 208 is coupled to the TDC 206 to facilitate cascading of at least one first-order sigma delta to the first-order sigma delta behavior of the VCO 204 and the TDC 206. In this example, the loop response of the divider-less DPLL system 200 is transformed to match those of the higher-order sigma delta. The reason being, a wraparound operation in the TDC 206 measurement is the same as the wraparound in the $1^{st}$ order sigma delta accumulator.

At block 306, selecting an edge of the feedback signal by the algorithm wherein the cascading extends a number of voltage controlled oscillator (VCO) cycles of the feedback signal in the measurement and the digitization of the delay is performed. For example, the algorithm in the sigma delta control unit 208 extends the TDC 206 to cover between zero and two VCO cycles for the loop response that matches a second-order sigma delta. In this example, the sigma delta control unit 208 includes a (N−1) order sigma delta block to facilitate the loop response.

Figure 4:
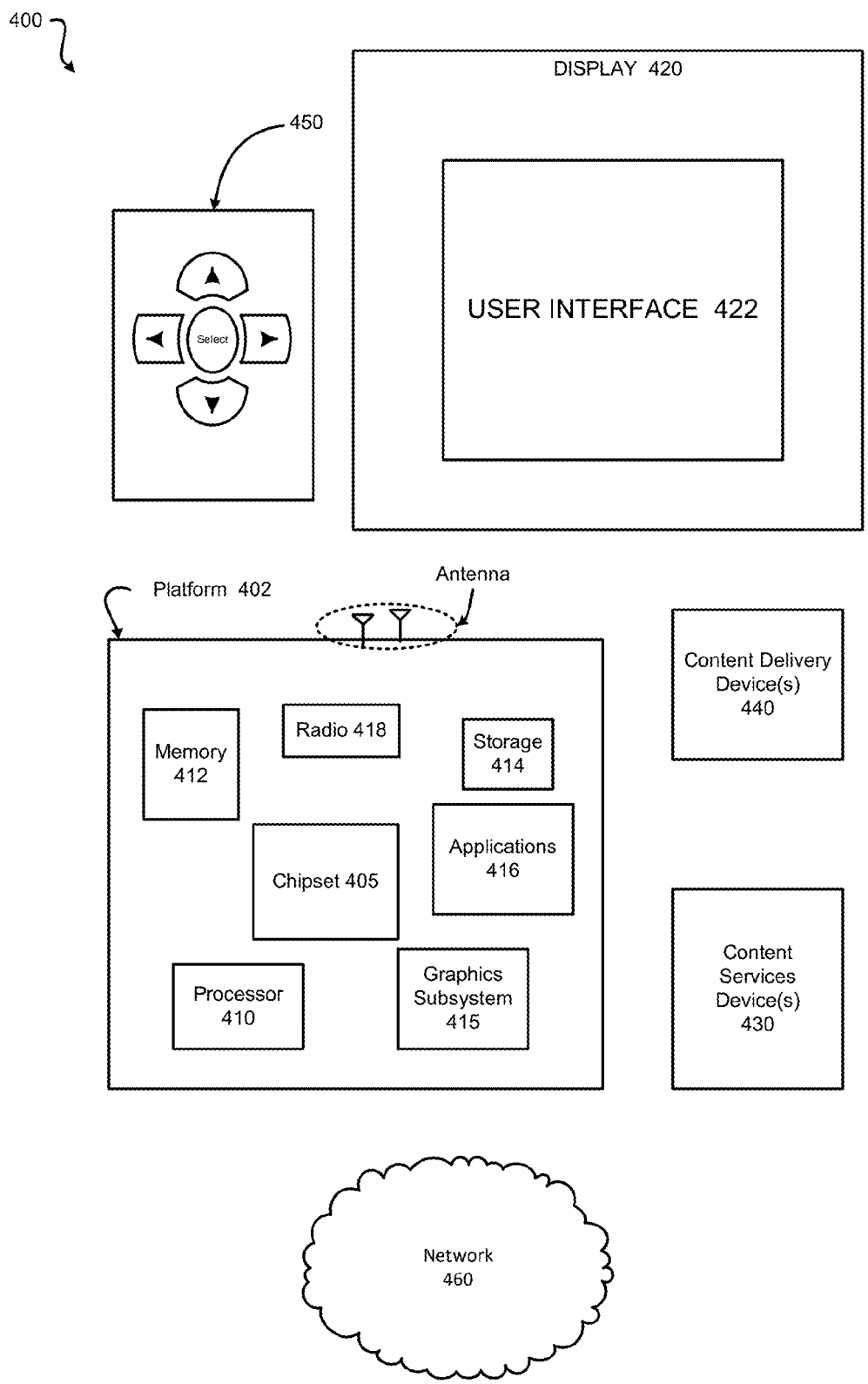
FIG. 4 illustrates an example system of a wireless device that utilizes a divider-less DPLL described in accordance with implementations herein.

FIG. 4 illustrates an example system 400 of a wireless device in accordance with the present disclosure. For example, the divider-less DPLL system 200 is circuitry block within the example system 400. In various implementations, the system 400 may be a media system although system 400 is not limited to this context. For example, system 400 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In various implementations, system 400 includes a platform 402 coupled to a display 420. Platform 402 may receive content from a content device such as content services device(s) 430 or content delivery device(s) 440 or other similar content sources. A navigation controller 450 including one or more navigation features may be used to interact with, for example, platform 402 and/or display 420. Each of these components is described in greater detail below.

In various implementations, platform 402 may include any combination of a chipset 405, processor 410, memory 412, storage 414, graphics subsystem 415, applications 416 and/or radio 418. Chipset 405 may provide intercommunication among processor 410, memory 412, storage 414, graphics subsystem 415, applications 416 and/or radio 418. For example, chipset 405 may include a storage adapter (not depicted) capable of providing intercommunication with storage 414.

Processor 410 may be implemented as a Complex Instruction Set Computer (CISC) or Reduced Instruction Set Computer (RISC) processors, x86 instruction set compatible processors, multi-core, or any other microprocessor or central processing unit (CPU). In various implementations, processor 410 may be dual-core processor(s), dual-core mobile processor(s), and so forth.

Memory 412 may be implemented as a non-volatile memory device such as, the PCM memory cell. In an implementation, the memory 412 is coupled to the processor 410 and a transceiver circuit (e.g., radio 418), which utilizes the divider-less DPLL system 200 in its circuitry block.

Storage 414 may be implemented as another non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 414 may include technology to increase the storage performance enhanced protection for valuable digital media when multiple hard drives are included, for example.

Graphics subsystem 415 may perform processing of images such as still or video for display. Graphics subsystem 415 may be a graphics processing unit (GPU) or a visual processing unit (VPU), for example. An analog or digital interface may be used to communicatively couple graphics subsystem 415 and display 420. For example, the interface may be any of a High-Definition Multimedia Interface, Display Port, wireless HDMI, and/or wireless HD compliant techniques. Graphics subsystem 415 may be integrated into processor 410 or chipset 405. In some implementations, graphics subsystem 415 may be a stand-alone card communicatively coupled to chipset 405.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general-purpose processor, including a multi-core processor. In further embodiments, the functions may be implemented in a consumer electronics device.

Radio 418 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 418 may operate in accordance with one or more applicable standards in any version. Furthermore, the radio 418 is a part of a transceiver block in the system 400 that may utilize the divider-less DPLL system 200 in its circuitry block.

In various implementations, display 420 may include any television type monitor or display. Display 420 may include, for example, a computer display screen, touch screen display, video monitor, television-like device, and/or a television. Display 420 may be digital and/or analog. In various implementations, display 420 may be a holographic display. In addition, display 420 may be a transparent surface that may receive a visual projection. Such projections may convey various forms of information, images, and/or objects. For example, such projections may be a visual overlay for a mobile augmented reality (MAR) application. Under the control of one or more software applications 416, platform 402 may display user interface 422 on display 420.

In various implementations, content services device(s) 430 may be hosted by any national, international and/or independent service and thus accessible to platform 402 via the Internet, for example. Content services device(s) 430 may be coupled to platform 402 and/or to display 420. Platform 402 and/or content services device(s) 430 may be coupled to a network 460 to communicate (e.g., send and/or receive) media information to and from network 460. Content delivery device(s) 440 also may be coupled to platform 402 and/or to display 420.

In various implementations, content services device(s) 430 may include a cable television box, personal computer, network, telephone, Internet enabled devices or appliance capable of delivering digital information and/or content, and any other similar device capable of unidirectionally or bidirectionally communicating content between content providers and platform 402 and/display 420, via network 460 or directly. It will be appreciated that the content may be communicated unidirectionally and/or bidirectionally to and from any one of the components in system 400 and a content provider via network 460. Examples of content may include any media information including, for example, video, music, medical and gaming information, and so forth.

Content services device(s) 430 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 402 may receive control signals from navigation controller 450 having one or more navigation features. The navigation features of controller 550 may be used to interact with user interface 422, for example. In embodiments, navigation controller 450 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 450 may be replicated on a display (e.g., display 420) by movements of a pointer, cursor, focus ring, or other visual indicators displayed on the display. For example, under the control of software applications 416, the navigation features located on navigation controller 450 may be mapped to virtual navigation features displayed on user interface 422, for example. In embodiments, controller 450 may not be a separate component but may be integrated into platform 402 and/or display 420. The present disclosure, however, is not limited to the elements or in the context shown or described herein.

In various implementations, drivers (not shown) may include technology to enable users to instantly turn on and off platform 402 like a television with the touch of a button after initial boot-up, when enabled, for example. Program logic may allow platform 402 to stream content to media adaptors or other content services device(s) 430 or content delivery device(s) 440 even when the platform is turned "off." In addition, chipset 405 may include hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various implementations, any one or more of the components shown in system 400 may be integrated. For example, platform 402 and content services device(s) 430 may be integrated, or platform 402 and content delivery device(s) 440 may be integrated, or platform 402, content services device(s) 430, and content delivery device(s) 440 may be integrated, for example. In various embodiments, platform 402 and display 420 may be an integrated unit. Display 420 and content service device(s) 430 may be integrated, or display 420 and content delivery device(s) 440 may be integrated, for example. These examples are not meant to limit the present disclosure.

In various embodiments, system 400 may be implemented as a wireless system, a wired system, or a combination of both. When implemented as a wireless system, system 400 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 400 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 402 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 4.

As described above, system 400 may be embodied in varying physical styles or form factors. FIG. 4 illustrates implementations of a small form factor device 400 in which system 400 may be embodied. In embodiments, for example, device 400 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

Figure 5:
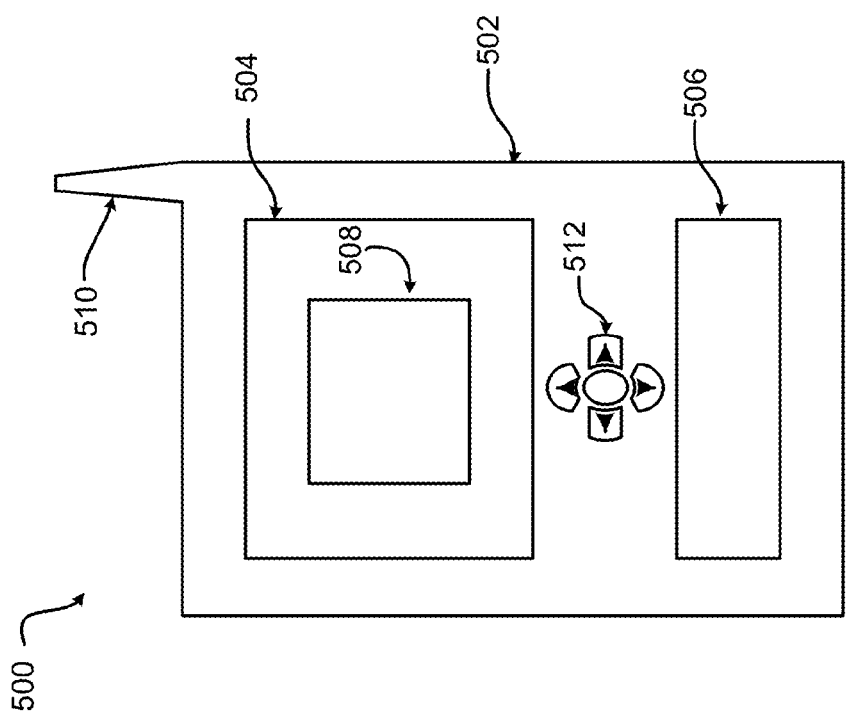
FIG. 5 is an example illustrates an example device that utilizes a divider-less DPLL in accordance with implementations described herein.

As shown in FIG. 5, device 500 may include a housing 502, a display screen 504, an input/output (I/O) device 506, a network interface card (NIC) 508 and a transceiver component 510. Device 500 also may include navigation features 512. The display screen 504 may include any suitable display unit for displaying information appropriate for a mobile computing device. For example, the display screen 504 displays the personalized message that the personalized communication program may generate. The I/O device 506 may include any suitable I/O device or user interface (UI) for entering information into a mobile computing device such as when the user 102 opts-in to the personalized communication program. Examples for I/O device 506 may include an alphanumeric keyboard, a numeric keypad, a touch pad, input keys, buttons, switches, rocker switches, microphones, speakers, voice recognition device and software, and so forth. Information also may be entered into device 500 by way of microphone (not shown). Such information may be digitized by a voice recognition device (not shown). The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

The following examples pertain to further embodiments:

Example 1 is a divider-less phase-locked loop (PLL) system comprising: a reference frequency oscillator configured to provide a reference signal; a voltage controlled oscillator (VCO) configured to provide a feedback signal; a time-to-digital converter (TDC) configured to receive the reference signal and the feedback signal, the TDC measures a time difference between the reference signal and the feedback signal; and a sigma delta control unit that is coupled to the TDC, the sigma delta control unit includes an algorithm that cascades at least one first-order sigma delta to the TDC.

In Example 2, the divider-less phase-locked loop system as recited in Example 1, wherein the sigma delta control unit utilizes a (N−1) order sigma delta block.

In Example 3, the divider-less phase-locked loop system as recited in Example 2, wherein the (N−1) order sigma delta block facilitates a second order sigma delta loop response in the TDC.

In Example 4, the divider-less phase-locked loop system as recited in Example 1, wherein operations of the VCO and the TDC is equivalent to a first order sigma delta.

In Example 5, the divider-less phase-locked loop system as recited in Example 1, wherein the cascading extends a number of VCO cycles for the TDC to use in measuring the time difference.

In Example 6, the divider-less phase-locked loop system as recited in Example 5, wherein the algorithm selects one edge of the VCO cycles for the TDC to use in measuring the time difference.

In Example 7, the divider-less phase-locked loop system as recited in Example 1, wherein the TDC covers zero to two VCO cycles of the feedback signal for a second-order sigma delta.

In Example 8, the divider-less phase-locked loop system as recited in Example 1, wherein the cascading facilitates a loop response that matches at least a second-order sigma delta.

In Example 9, the divider-less phase-locked loop system as recited in Example 1 further comprising a digital phase detector (DPD), wherein the DPD is configured to measure a frequency error at an output of the TDC.

In Example 10, a method of implementing a divider-less digital phase-locked loop (DPLL), the method comprising: receiving of a reference signal and a feedback signal; performing an algorithm that cascades a first-order sigma delta to a measurement and a digitization of a delay between the reference signal and the feedback signal; and selecting an edge of the feedback signal by the algorithm, wherein the cascading extends a number of voltage controlled oscillator (VCO) cycles of the feedback signal in the measurement and the digitization of the delay.

In Example 11, the method as recited in Example 10, wherein the cascading of the first-order sigma delta facilitates a second order sigma delta loop response.

In Example 12, the method as recited in Example 11, wherein the edge is selected from a zero to two VCO cycles of the feedback signal for the second order sigma delta.

In Example 13, the method as recited in Example 10, wherein the cascading of the first-order sigma delta facilitates a loop response that matches at least a second-order sigma delta.

In Example 14, a wireless device comprising: one or more processors; and a transceiver coupled to the one or more processors, the transceiver further comprises: a reference frequency oscillator configured to provide a reference signal; a voltage controlled oscillator (VCO) configured to provide a feedback signal; a time-to-digital converter (TDC) configured to receive the reference signal and the feedback signal; and a sigma delta control unit that is coupled to the TDC, the sigma delta control unit includes an algorithm that cascades at least one first-order sigma delta to the TDC.

In Example 15, the wireless device as recited in Example 14, wherein the sigma delta control unit utilizes a (N−1) order sigma delta block.

In Example 16, the wireless device as recited in Example 15, wherein the (N−1) order sigma delta block facilitates a second order sigma delta loop response in the TDC.

In Example 17, the wireless device as recited in Example 14, wherein operations of the VCO and the TDC is equivalent to a first order sigma delta.

In Example 18, the wireless device as recited in Example 14, wherein the cascading extends a number of VCO cycles for the TDC to use in measuring a time difference between the reference signal and the feedback signal.

In Example 19, the wireless device as recited in Example 18, wherein the algorithm selects one edge of the VCO cycles for the TDC to use in measuring the time difference.

In Example 20, the wireless device as recited in Example 14, wherein the TDC covers zero to two VCO cycles of the feedback signal for a second-order sigma delta.

What is claimed is:

1. A divider-less phase-locked loop (PLL) system comprising:
   a reference frequency oscillator configured to provide a reference signal;
   a voltage controlled oscillator (VCO) configured to provide a feedback signal;
   a time-to-digital converter (TDC) configured to receive the reference signal and the feedback signal, the TDC measures a time difference between the reference signal and the feedback signal; and
   a sigma delta control unit that is coupled to the TDC, the sigma delta control unit includes an algorithm that cascades at least one first-order sigma delta to the TDC and extends a number of VCO cycles for the TDC to use in measuring the time difference.

2. The divider-less phase-locked loop system as recited in claim 1, wherein the sigma delta control unit utilizes a (N−1) order sigma delta block, where N is an integer.

3. The divider-less phase-locked loop system as recited in claim 2, wherein the (N−1) order sigma delta block facilitates a second order sigma delta loop response in the TDC.

4. The divider-less phase-locked loop system as recited in claim 1, wherein operations of the VCO and the TDC is equivalent to a first order sigma delta.

5. The divider-less phase-locked loop system as recited in claim 1, wherein the algorithm selects one edge of the VCO cycles for the TDC to use in measuring the time difference.

6. The divider-less phase-locked loop system as recited in claim 1, wherein the TDC covers zero to two VCO cycles of the feedback signal for a second-order sigma delta.

7. The divider-less phase-locked loop system as recited in claim 1, wherein the cascading facilitates a loop response that matches at least a second-order sigma delta.

8. The divider-less phase-locked loop system as recited in claim 1 further comprising a digital phase detector (DPD), wherein the DPD is configured to measure a frequency error at an output of the TDC.

9. A method of implementing a divider-less digital phase-locked loop (DPLL), the method comprising:
   receiving of a reference signal and a feedback signal;
   performing an algorithm that cascades a first-order sigma delta to a measurement and a digitization of a delay between the reference signal and the feedback signal; and
   selecting an edge of the feedback signal by the algorithm, wherein the cascading extends a number of voltage controlled oscillator (VCO) cycles of the feedback signal in the measurement and the digitization of the delay.

10. The method as recited in claim 9, wherein the cascading of the first-order sigma delta facilitates a second order sigma delta loop response.

11. The method as recited in claim 10, wherein the edge is selected from a zero to two VCO cycles of the feedback signal for the second order sigma delta.

12. The method as recited in claim 9, wherein the cascading of the first-order sigma delta facilitates a loop response that matches at least a second-order sigma delta.

13. A wireless device comprising: one or more processors; and
   a transceiver coupled to the one or more processors, the transceiver further comprises:
   a reference frequency oscillator configured to provide a reference signal;
   a voltage controlled oscillator (VCO) configured to provide a feedback signal;
   a time-to-digital converter (TDC) configured to receive the reference signal and the feedback signal; and
   a sigma delta control unit that is coupled to the TDC, the sigma delta control unit includes an algorithm that cascades at least one first-order sigma delta to the TDC and extends a number of VCO cycles for the TDC to use in measuring the time difference.

14. The wireless device as recited in claim 13, wherein the sigma delta control unit utilizes a (N−1) order sigma delta block, wherein N is an integer.

15. The wireless device as recited in claim 14, wherein the (N−1) order sigma delta block facilitates a second order sigma delta loop response in the TDC.

16. The wireless device as recited in claim 13, wherein operations of the VCO and the TDC is equivalent to a first order sigma delta.

17. The wireless device as recited in claim 13 wherein the algorithm selects one edge of the VCO cycles for the TDC to use in measuring the time difference.

18. The wireless device as recited in claim 13, wherein the TDC covers zero to two VCO cycles of the feedback signal for a second-order sigma delta.

* * * * *